United States Patent
Baek et al.

(10) Patent No.: US 7,632,754 B2
(45) Date of Patent: Dec. 15, 2009

(54) METHOD FOR FORMING METAL LINE IN A SEMICONDUCTOR DEVICE

(75) Inventors: In-Cheol Baek, Seoul (KR); Han-Choon Lee, Seoul (KR)

(73) Assignee: Dongbu Hi-Tek Co., Ltd., Seoul (KR)

( * ) Notice: Subject to any disclaimer, the term of this patent is extended or adjusted under 35 U.S.C. 154(b) by 179 days.

(21) Appl. No.: 11/617,242

(22) Filed: Dec. 28, 2006

(65) Prior Publication Data

US 2007/0166987 A1 Jul. 19, 2007

(30) Foreign Application Priority Data

Dec. 29, 2005 (KR) .................. 10-2005-0134056

(51) Int. Cl.
*H01L 21/4763* (2006.01)
(52) U.S. Cl. .................. 438/643; 438/676; 438/785; 257/E21.204
(58) Field of Classification Search .......... 438/637, 438/643, 676, 785; 257/751; 427/569, 570, 427/576
See application file for complete search history.

(56) References Cited

U.S. PATENT DOCUMENTS

| 2005/0124154 A1* | 6/2005 | Park et al. ............... 438/643 |
| 2006/0091559 A1* | 5/2006 | Nguyen et al. .......... 257/775 |
| 2006/0211228 A1* | 9/2006 | Matsuda ................. 438/575 |

OTHER PUBLICATIONS

Rossnagel et a., "Plasma-enhanced atomic layer deposition of Ta and Ti for interconnect diffusion barriers", J. Vac. Sci. Technol. B 18(4), Jul./Aug. 2000, pp. 2016-2020.*

* cited by examiner

*Primary Examiner*—Ha Tran T Nguyen
*Assistant Examiner*—Daniel Whalen
(74) *Attorney, Agent, or Firm*—Sherr & Vaughn, PLLC

(57) ABSTRACT

A method for forming a metal line of a semiconductor device includes forming an interlayer insulation film over a semiconductor substrate, forming a trench for exposing at least a portion of the semiconductor substrate by using a selective etching process, and forming a diffusion barrier layer over the interlayer film and the inner walls of the trench, by using a plasma enhanced atomic layer deposition process in which a high frequency power generator is set to have a frequency of 13.56 MHz. The plasma enhanced atomic layer deposition process is performed with a base pressure in a chamber maintained at $1 \times 10^{-8}$ to $3 \times 10^{-7}$ torr.

4 Claims, 3 Drawing Sheets

METHOD FOR FORMING METAL LINE IN A SEMICONDUCTOR DEVICE

The present application claims priority under 35 U.S.C. 119 and 35 U.S.C. 365 to Korean Patent Application No. 10-2005-0134056 (filed on Dec. 29, 2005), which is hereby incorporated by reference in its entirety.

BACKGROUND

As semiconductors achieve higher levels of integration and ever faster switching speeds, metal wiring layers formed within the semiconductor devices are getting finer and using multiple layers. A damascene process may be used to form fine copper wiring. A physical vapor deposition may be used to form a diffusion barrier layer over an interlayer insulation film including a trench formed in the interlayer insulation film.

However, although physical vapor deposition has advantages such as a simple deposition process and good electrical characteristics, it has various disadvantages such as poor step coverage. Another disadvantage is that the thickness of a diffusion barrier layer may not be controlled precisely, down to a few angstroms (Å).

Accordingly, plasma enhanced atomic layer deposition (PEALD) may be used, in which a plasma process is introduced into an atomic layer deposition (ALD) process in which a deposition source gas used for forming the diffusion barrier layer is provided in independent pulses during controlled intervals.

However, plasma enhanced atomic layer deposition has a drawback in that the resistivity of the deposited film is increased while the uniformity of the diffusion barrier layer is decreased, relative to physical vapor deposition.

SUMMARY

Embodiments relate to a method for forming a metal line in a semiconductor device; and, more particularly, to a method for forming copper wiring by using a plasma enhanced atomic layer deposition process.

Embodiments relate to a method for forming a metal line in a semiconductor device which improves the characteristics of a diffusion barrier layer by improving a plasma enhanced atomic layer deposition process.

Embodiments relate to a method for forming a metal line of a semiconductor device, comprising: forming an interlayer insulation film over a semiconductor substrate; forming a trench exposing at least a portion of the semiconductor substrate by using a selective etching process; and forming a diffusion barrier layer over the interlayer film and the inner walls of the trench, by using a plasma enhanced atomic layer deposition process in which a high frequency power generator may be set to a frequency of about 13.56 MHz.

Embodiments relate to a method for forming a metal line in a semiconductor device, comprising: forming an interlayer insulation film over a semiconductor substrate; forming a trench exposing at least a portion of the semiconductor substrate by using a selective etching process; and forming a diffusion barrier layer over the interlayer film and inner walls of the trench by using a plasma enhanced atomic layer deposition process in which $H_2$ gas of 50 to 150 sccm and $NH_3$ gas of 20 to 100 sccm are injected as a reaction gas.

BRIEF DESCRIPTION OF THE DRAWINGS

Example

DETAILED DESCRIPTION

Figure 1:
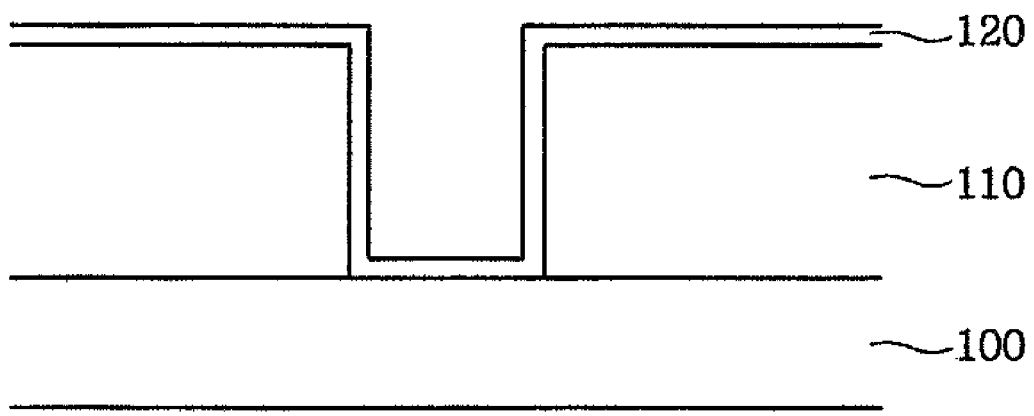
FIG. 1 is a cross sectional view of a method for forming a metal line of a semiconductor device in accordance with embodiments; and Example

In the drawings, in order to represent various layers and regions in a clear manner, their thicknesses are represented to be enlarged. Through the entire specification, like elements are designated by the same reference numerals. If a portion such as a layer, a film, a region or a plate is referred to be positioned on another portion, such an expression may incorporate a case in which there exists still another portion therebetween as well as a case in which the portion is positioned right on said another portion. On the contrary, if a portion is referred to be positioned right on another portion, it means that there is no still another portion therebetween.

As shown in example FIG. 1, an interlayer insulation film 110 is formed over a semiconductor substrate 100. The semiconductor 100 may have individual devices, for example transistors, (not shown) or metal lines (not shown) thereon.

A selective etching process is used to remove a portion of the interlayer insulation film 110 to form a trench for exposing a portion of the semiconductor substrate 100. Then, a plasma enhanced atomic layer deposition process is used to form a diffusion barrier layer 120 over the interlayer insulation film 110 including the trench. The diffusion barrier layer 120 may be formed of a TaN film.

The characteristics of diffusion barrier layer 120 may be enhanced by controlling conditions of the plasma enhanced atomic layer deposition process. The enhanced characteristics are described in detail with reference to example Table 1 and example FIGS. 1 to 4.

Figure 2:
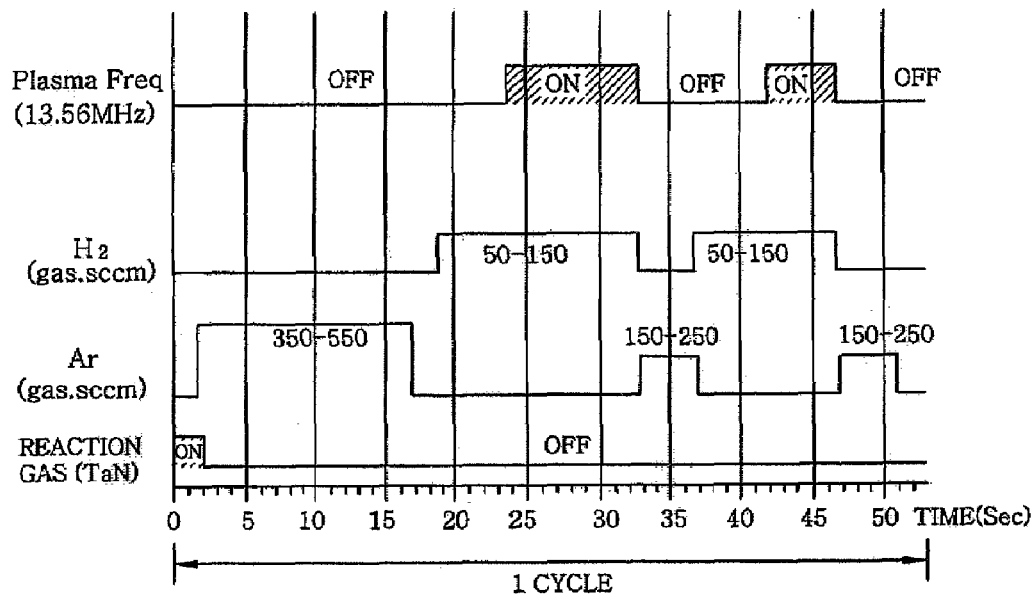
FIGS. 2 to 4 are gas pulsing diagrams when a TaN film is formed by changing process conditions of a plasma enhanced atomic layer deposition process.
Figure 3:
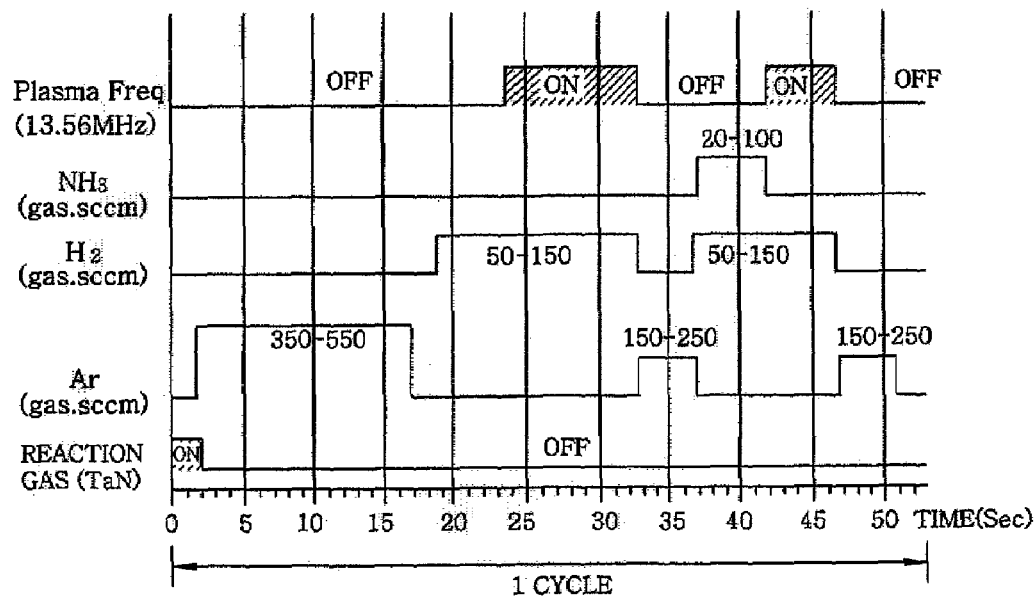
Figure 4:
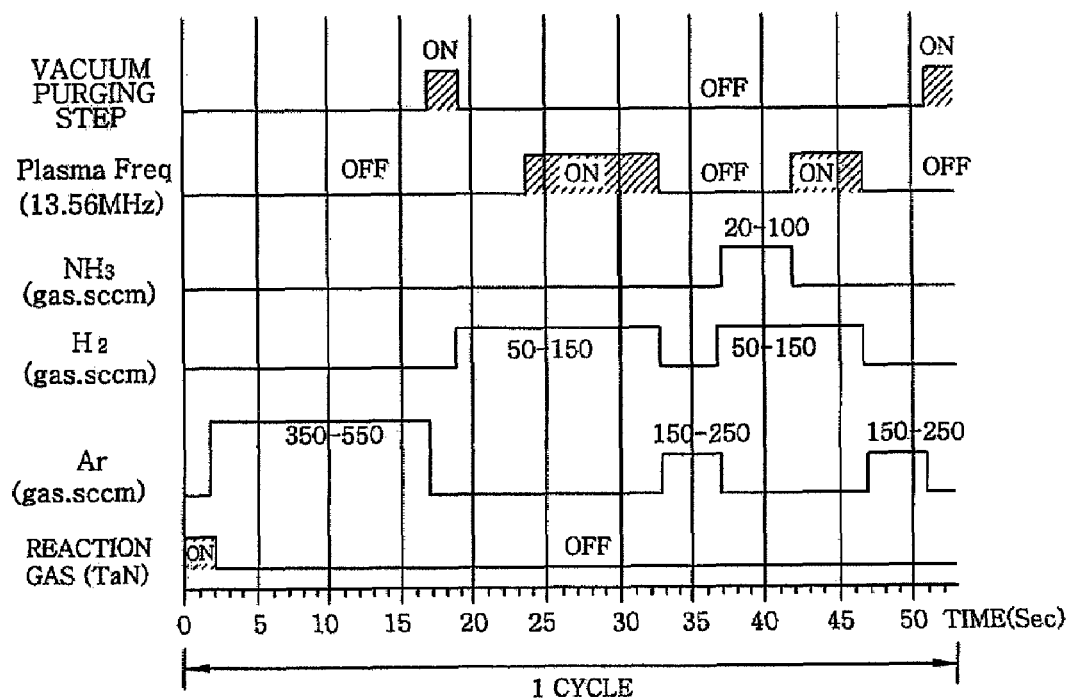

Example Table 1 illustrates the measured characteristics of TaN films obtained by plasma enhanced atomic layer deposition process under varied conditions. FIGS. 2 to 4 are gas pulsing diagrams for changing process conditions of the plasma enhanced atomic layer deposition process to form a TaN film.

EXAMPLE TABLE 1

| Changed Process Condition | Gas Flow rate (sccm) | | Cycle | Sheet Resistance ($\Omega/\square$) | | Thickness (Å) | | Resistivity ($\mu\Omega \cdot cm$) |
|---|---|---|---|---|---|---|---|---|
| | $H_2$ | $NH_3$ | | Mean | Standard Deviation | Mean | Standard Deviation | |
| Condition 1 Frequency: 13.56 MHz | ○ | X | 100 | 639.7 | 14.03 | 86.06 | 1.97 | 550.52 |
| Condition 2 Base Pressure Decreased | ○ | ○ | 100 | 539.6 | 8.61 | 66.67 | 3.33 | 359.76 |

EXAMPLE TABLE 1-continued

| Changed Process Condition | Gas Flow rate (sccm) | | Cycle | Sheet Resistance (Ω/□) | | Thickness (Å) | | Resistivity (μΩ·cm) |
|---|---|---|---|---|---|---|---|---|
| | H₂ | NH₃ | | Mean | Standard Deviation | Mean | Standard Deviation | |
| Condition 3 Vacuum Purging Step Added | ○ | ○ | 100 | 556.2 | 4.02 | 66.08 | 2.01 | 367.53 |

The diffusion barrier layer 120 may be formed according to a plasma enhanced atomic layer deposition process, in which a high frequency power generator for generating a plasma has a frequency of 400 KHz, the base pressure in the chamber is $1\times10^{-3}$ torr, $H_2$ gas of 50 to 150 sccm is used as a reaction gas, and Ar gas of 350 to 550 sccm or 150 to 250 sccm is used as a purging gas.

FIG. 2 is a one-cycle gas pulsing diagram for condition 1 in Table 1, in which the frequency of the high frequency power generator in a plasma enhanced atomic layer deposition apparatus is set to the international standard frequency, i.e. 13.56 MHz.

One cycle may have a time period of about 53 seconds. When a cycle is started, a deposition source gas, which may be TaN, is injected into the plasma enhanced atomic layer deposition apparatus. The injection time period may be a 0 to 2 second interval.

A purging gas may then be injected at a rate of 350 to 550 sccm during the 2 to 17 second interval through an injection port into the chamber. The purging gas may be, for example, Ar gas.

A reaction gas may be injected at a rate of 50 to 150 sccm during the 19 to 33 second interval through the injection port into the chamber. The reaction gas is used to remove the impurity atoms which might be included in the deposition source gas. The reaction gas may be, for example $H_2$ gas.

During the 24 to 33 second interval, a plasma may be generated while supplying $H_2$ into the chamber. The high frequency power generator for generating the plasma may have the international standard frequency of 13.56 MHz.

During the 33 to 37 second interval, purging gas Ar may be injected at a rate of 150 to 250 sccm through the injection port into the chamber.

During the 37 to 47 second interval, reaction gas $H_2$ may be reinjected at a rate of 50 to 150 sccm through the injection port into the chamber. During the 42 to 47 second interval, the high frequency power generator generates plasma using the international standard frequency of 13.56 MHz while supplying $H_2$ into the chamber.

During the 47 to 51 second interval, purging Ar gas may be injected at a rate of 150 to 250 sccm through the injection port into the chamber. After two more seconds elapse, one cycle of the plasma enhanced atomic layer deposition is terminated. A single atomic layer of the TaN diffusion barrier film 120 has been formed over the interlayer insulation film 110, including the inner walls of the trench.

The characteristics of the TaN film formed under conditions shown in example FIG. 2 are illustrated in example Table 1. The sheet resistance has a mean of about 639.7 Ω/□ and a standard deviation of about 14.03 Ω/□. The thickness of a TaN film formed over 100 cycles has a mean of about 86.06 Å and a standard deviation of 1.97 Å.

The resistivity is about 550.52 μΩ·cm. By changing the plasma generation frequency of the high frequency power generator from a value of 400 KHz to 13.56 MHz, the resistivity is reduced from about 960 μΩ·cm to about 550.52 μΩ·cm, which constitutes a significant enhancement of the characteristics of the TaN film.

FIG. 3 is another one-cycle gas pulsing diagram corresponding to condition 2 in Table 1, in which the base pressure of the plasma enhanced atomic layer deposition apparatus is reduced and a reaction gas is added.

Accordingly, the procedure of the plasma enhanced atomic layer deposition process shown in example FIG. 3 is similar to that of example FIG. 2. Only the process for injecting another reaction gas at a rate of 20 to 100 sccm during the 37 to 42 second interval through the injection port into the chamber is added. The reaction gas may be, for example, $NH_3$.

The base pressure for the process is reduced to between about $1\times10^{-8}$ to $3\times10^{-7}$ torr. The base pressure is a pressure maintained in the chamber before the PEALD process is performed by removing the remaining gas in the chamber through a vacuum pump.

The characteristic of the TaN film formed under the condition shown in FIG. 3 may be shown in the measuring result of example Table 1. The sheet resistance has the mean of about 539.6 Ω/□ and the standard deviation of about 8.61 Ω/□. Further, the thickness of the TaN film formed over 100 cycles has a mean of about 66.67 Å and a standard deviation of about 3.33 Å. And, the resistivity is about 359.76 μΩ·cm.

Accordingly, when comparing the results for condition 2 to the results for condition 1, the standard deviation of the sheet resistance is reduced from about 14.03 Ω/□ to about 8.61 Ω/□ so that film uniformity may be improved. The mean thickness of the TaN film formed over 100 cycles is reduced from about 86.06 Å to about 66.67 Å so that the film density may be increased. Further, the resistivity is reduced from about 550.52 μΩ·cm to about 359.76 μΩ·cm so that the characteristics of the TaN film have been further improved.

Example FIG. 4 shows still another one-cycle gas pulsing diagram corresponding to example condition 3 in Table 1, in which a vacuum purging step is added into the plasma enhanced atomic layer deposition process.

Accordingly, the procedure of the plasma enhanced atomic layer deposition process shown in example FIG. 4 is similar to that of example FIG. 3. Only a vacuum purging step is added during the 17 to 19 second interval and 51 to 53 second interval. That is, as soon as the purging process by Ar gas is terminated, the vacuum purging process is started.

The characteristics of the TaN film formed in accordance with the condition shown in example FIG. 4 may be shown in example Table 1.

The sheet resistance has a mean of about 556.2 Ω/□ and a standard deviation of about 4.02 Ω/□. The thickness of a TaN film formed over 100 cycles has a mean of about 66.08 Å and a standard deviation of about 2.01 Å. And, the resistivity is about 367.53 μΩ·cm.

Accordingly, compared to the film corresponding to condition 2, the standard deviation of the sheet resistance is reduced from about 8.61 Ω/□ to about 4.02 Ω/□ so that film uniformity may be further improved.

In a method for forming the metal line in the semiconductor device in accordance with embodiments, the frequency of the high frequency power generator in the plasma enhanced atomic layer deposition apparatus is changed, the base pressure is reduced, $NH_3$ is added as a reaction gas, and the vacuum purging step is added. Consequently, the characteristics of the TaN film is allowed to be improved so that the characteristics of the TaN film have been further improved.

Specifically, the standard deviation of the sheet resistance of the TaN film is reduced to improve the film uniformity, and the mean thickness of the film deposited through the same cycle is reduced to improve the density of the film. Furthermore, the resistivity is decreased to allow the resistor-capacitor (RC) delay to be lowered.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming an interlayer insulation film over a semiconductor substrate;
   forming a trench exposing at least a portion of the semiconductor substrate by using a selective etching process; and
   forming a diffusion barrier layer over the interlayer film and an inside wall of the trench by using a plasma enhanced atomic layer deposition process in which a high frequency power generator is set to a specific frequency, and 50 to 150 sccm of $H_2$ gas and 20 to 100 sccm of $NH_3$ gas are injected as a reaction gas,
   wherein the plasma enhanced atomic layer deposition process is performed with a base pressure in a chamber maintained at $1\times10^{-8}$ to $3\times10^{-7}$ torr, and wherein the plasma enhanced atomic layer deposition process further includes an Ar purging step, wherein a vacuum purging step is started immediately after the Ar purging step is terminated.

2. The method of claim 1, wherein the method is used to form a metal line in a semiconductor device.

3. The method of claim 1, the specific frequency is the international standard frequency.

4. The method of claim 3, the international standard frequency is 13.56 MHz.

* * * * *